United States Patent [19]
Temple

[11] Patent Number: 6,057,612
[45] Date of Patent: May 2, 2000

[54] FLAT POWER PACK

[75] Inventor: Victor A. K. Temple, Clifton Park, N.Y.

[73] Assignee: Intersil Corporation, Palm Bay, Fla.

[21] Appl. No.: 09/109,268

[22] Filed: Jul. 2, 1998

[51] Int. Cl.[7] ........................................... H02J 7/00
[52] U.S. Cl. ..................... 307/150; 361/688; 361/704; 361/718
[58] Field of Search .................... 307/150; 361/688, 361/704, 707, 715, 716–718; 257/700, 703, 707, 712; 438/6, 106, 107, 110, 138; 174/52.1, 52.3

[56] References Cited

U.S. PATENT DOCUMENTS

| | | | |
|---|---|---|---|
| 5,014,159 | 5/1991 | Butt | 361/386 |
| 5,016,138 | 5/1991 | Woodman | 361/381 |
| 5,295,044 | 3/1994 | Araki et al. | 361/709 |
| 5,574,312 | 11/1996 | Bayerer et al. | 257/706 |
| 5,702,985 | 12/1997 | Burns | 437/217 |
| 5,736,780 | 4/1998 | Murayama | 257/673 |

*Primary Examiner*—Jeffrey Gaffin
*Assistant Examiner*—Peter Zura
*Attorney, Agent, or Firm*—Rogers & Killeen

[57] ABSTRACT

A power pack including a power device and driver circuit sandwiched between a base plate and a lid. The base plate and lid having flat exterior surfaces for bonding with heat exchangers and/or an external bus to provide both two-sided cooling and two-sided electrical access. The driver circuit and power device are spaced apart to allow parallel and separate thermal conduction paths to both the base plate and lid. The power pack further including a seal enclosing the power device and driver circuit between the base plate and lid.

52 Claims, 5 Drawing Sheets

FLAT POWER PACK

BACKGROUND OF THE INVENTION

The present invention relates to power packs and, more specifically to low profile power packs having an integrated driver circuit.

A power pack is a power supply unit that converts the available power line or battery voltage to the voltage values required by a unit of electronic equipment. A power pack may include only one semiconductor power device with appropriate packaging (i.e., a power semiconductor module) or may include a plurality of semiconductor power devices with appropriate packaging and configuration circuitry. The Improved capabilities of semiconductor power devices such as MOS Controlled Thyristors and Insulated Gate Bipolar Transistors in handling high current, voltage, and switching speed requirements has caused a need for more effective means of cooling power packs or dissipating energy generated by the power devices. For example, without effective cooling increased current rating for power packs are inconsequential.

There is also a demand for the rapid physical and electrical integration of power packs into applications while minimizing system footprint or compromising performance. Prior art devices provide power semiconductor power packs having a top lid, base plate, and power semiconductor device which is sandwiched between the lid and plate. In the prior art, the lid and power semiconductor device are attached using duck feet or copper balls to allow electrical conduction through the lid. Additionally, the prior art includes power packs having a driver circuit stacked on the power semiconductor device between the lid and base plate. These devices generally do not provide isolated cooling for the driver circuit, parallel cooling for the driver circuit and power semiconductor device, extremely low thermal resistance for the power semiconductor device and driver circuit, simple interface capability, two sided cooling, and the capability of being stacked and interconnected to form larger more complex power packs.

Accordingly, it is an object of the present invention to provide a novel flat power pack.

It is another object of the present invention to provide a novel low profile power pack having a simple control interface.

It is still another object of the present invention to provide a novel two-sided cooled and two-sided external bus power pack including a driver circuit.

It is a further object of the present invention to provide a novel layered power electronics module having a middle layer including a power device and a driver circuit.

It is yet a further object of the present invention to provide a novel flat power pack having outside surfaces that bond directly to a heat exchanger.

It is still a further object of the present invention to provide a novel power pack having driver circuitry with two sided cooling.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
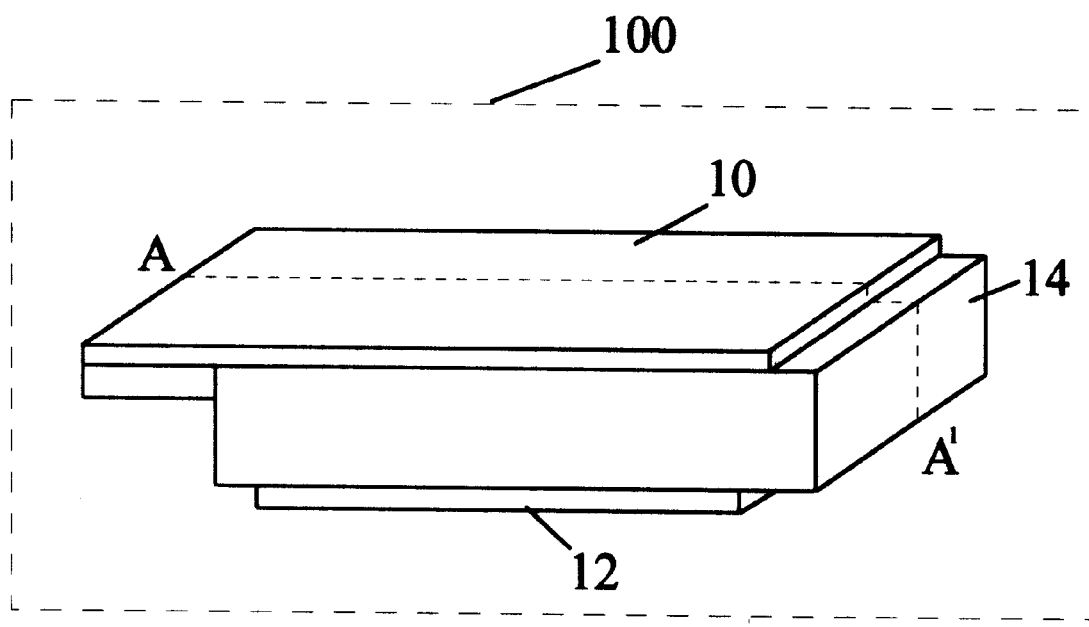
FIG. 1 is an pictorial view of an exterior of a power pack.

With reference to FIG. 1, a power pack 100 may include a lid or top layer 10, a base plate or bottom layer 12, and a middle layer 14. The middle layer 14 may include a seal for enclosing circuitry (not shown) between the lid 10 and the base plate 12.

Figure 2:
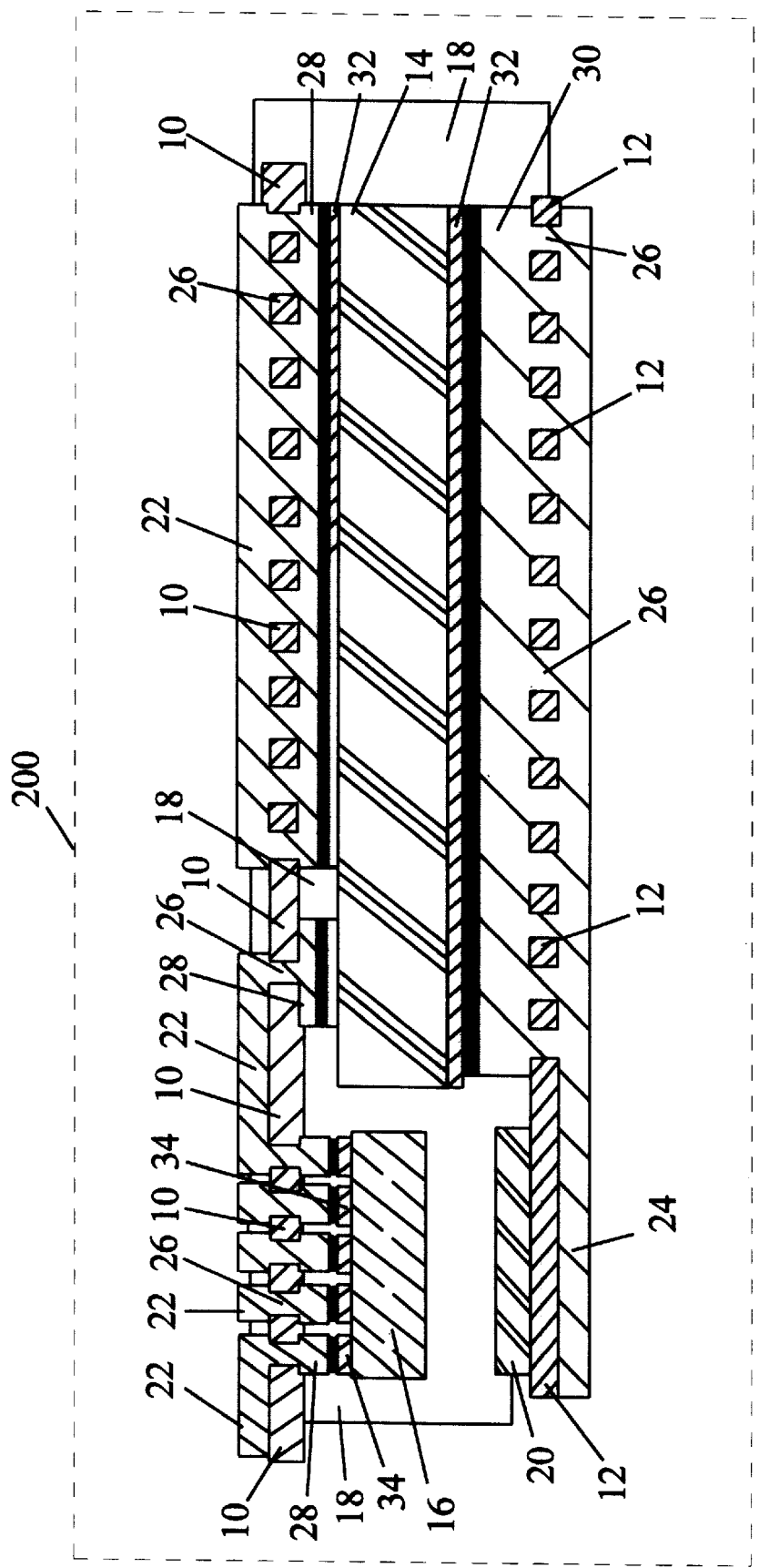
FIG. 2 is a cross-sectional view along plane A–A' of FIG. 1 illustrating one embodiment of a power pack of the present invention.

With reference to FIG. 2, a power pack 200 may include a lid 10, a base plate 12, a semiconductor power device 14, a semiconductor driver circuit 16, a seal 18, and thermal gel 20. The lid 10 and the base plate 12 may be comprised of a ceramic substrate. Metal traces patterned on the lid 10 and the base plate 12 may form a metalized interior lid surface 28, a metalized interior base plate surface 30, a metalized exterior lid surface 22, and a metalized exterior base plate surface 24 which may provide interconnects to very complex in-board control circuitry and enable complex interconnection of power circuit elements. The exterior metalized lid surface 22 and base plate surface 24 may provide two-sided connection of the power pack with an external bus (not shown).

The lid 10 and base plate 12 may each have metalized vias or feed-through holes 26 contiguous with the metalized exterior and interior surfaces 22, 24, 28, and 30 for conducting electrical signals through the lid 10 and the base plate 12, respectively. The power device 14 and driver circuit 16 may each have metalized surfaces 32 and 34, respectively, which are suitably patterned to match the interior metalized lid surface 28 and/or interior metalized base plate surface 30.

The driver circuit 16 and power device 14 may be directly bonded by soldering or brazing to the lid 10 and/or base plate 12. The direct bond is preferably with a thick solder layer. Another technique for bonding the driver circuit 16 and power device 14 to the metalized surfaces of the lid 10 and/or base plate 12 may be by solid diffusion usually at an elevated temperature and/or pressure (e.g., thermal compression of noble metals or diffusion bonded aluminum to gold). For high voltages, crossing metal die runs directly over a high voltage termination should be avoided.

The power pack 200 may be sealed with a gel/hard epoxy seal 18. The gel improves junction voltage reliability and prevents internal package arcing while the epoxy provides strength and prevents package contamination. For hermetic sealing, an "edge seal ring" may be used on each individual die or an expansion matching wall may be inserted between the lid 10 and the base plate 12 and around the power device 14 and driver circuit 16.

The power device 14 may be a MOS controlled thyristor, silicon controlled rectifier, bipolar junction transistor, power diode, insulated gate bipolar transistor, or other solid state semiconductor device having high voltage and current capacity.

Both the base plate 12 and lid 10 may be "high temperature circuit boards" otherwise known as "ceramic circuit boards." The manufacture and structure of "high temperature circuit boards" are known in the art. Essentially, the "circuit boards" are ceramic substrates having metalized surfaces which may be direct bonded to circuitry to form a power pack. The "circuit boards" may also interconnect a plurality of switching devices and diodes with appropriate gate driver circuits such as half-bridge, rectifier bridge, full bridge, and three-phase bridge.

To reduce manufacturing costs, only the lid (or the base plate) may be a "high temperature circuit board" which will provide at least one-sided thermal and electrical conduction while the base plate (or lid) may be made of inexpensive substrate providing structural support for the power pack. The base plate or lid may comprise a an insulating substrate (e.g., a non-ceramic insulator) with metalized surfaces and a sufficient number of metal vias to provide both electrical and thermal conduction through the substrate.

In operation, electrical signals from external devices (not shown) are provided to the power pack 200 on the exterior metalized lid surface 22 and exterior metalized base plate surface 24. Metalized vias 26 and the interior metalized lid and base plate surfaces 32 and 30 provide a medium for directing the electrical signal on the exterior surfaces to the interior of the power pack 200. Metalized surfaces 32 on two sides of the power device 14 receive the electrical signals for operation by the power device 14. The metalized surfaces 34 on one side of the driver circuit 16 receive the electrical signals passing through the lid 10 for operation by the driver circuit 16. The exterior metalized lid surfaces 22, metalized vias 26, and metalized surfaces 32 of the lid 10 may interconnect the power device 14 and the driver circuit 16 so that the power device 14 may be controlled by the driver circuit 16.

Heat generated by the driver circuit 16 may be transferred to the lid 10 through the low resistance direct bond between the metalized surfaces of the driver circuit 34 and the metalized surfaces of the lid 28. Heat generated by the driver circuit 34 may also be transferred to the base plate 12 through the thermal gel 20. The thermal gel 20 may be of a low thermal resistance material.

Suitable cooling of the power pack may be provided by heat exchangers (not shown). A first heat exchanger may be placed in a heat transfer relationship with the exterior metalized lid surface 22 and/or a second heat exchanger may be placed in a heat transfer relationship with the exterior metalized base plate surface 24. The two heat exchangers provide double-sided cooling which maximizes the cooling surface area of the power pack.

To prevent structural corruption of the power pack during heat generating operation, the coefficient of thermal expansion of the base plate 12, lid 10, power device 14, driver circuit 16, and seal 18 must approximately match. For larger power device or driver circuit die, the coefficient of thermal expansion of the base plate 12 and the lid 10 must be matched closer to silicon.

Figure 3:
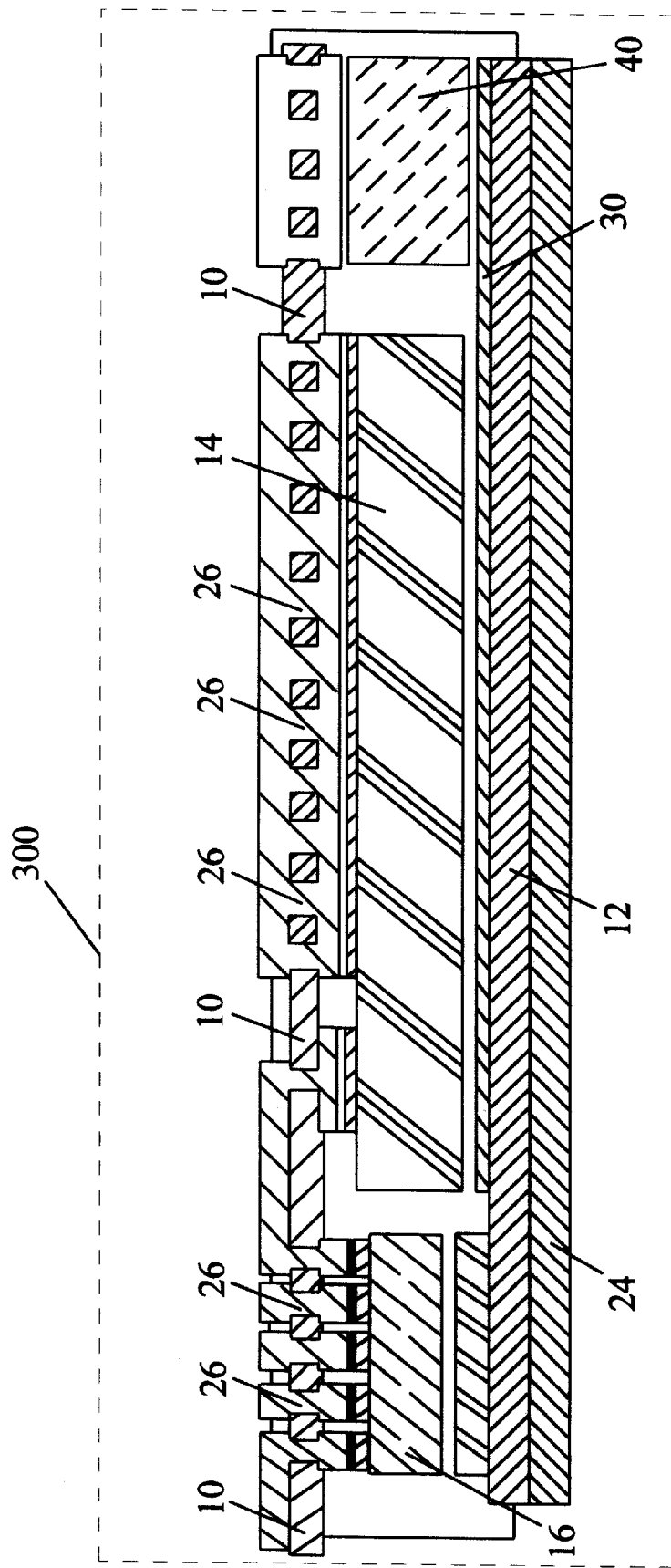
FIG. 3 is a cross-sectional view along plane A–A' of FIG. 1 illustrating a second embodiment of a power pack of the present invention.

With reference to FIG. 3, a power pack 300 may include the same structure as the power pack 200 of FIG. 2 except that electrical signal access to the power device 14 is only through the lid 10. For a double-sided external bus, interconnect 40 may be used to transfer electrical signal from the base plate to the lid for conduction to the interior of the power device 14 or driver circuit 16. The interconnect 40 may be comprised of a metal such as Copper-Molybdenum. The interconnect 40 may be bonded by brazing or soldering to the lid 10 and base plate 12. The size of the interconnect 40 is matched with the size of the power device 14 and driver circuit 16 to minimize power pack profile.

In operation, electrical signals on the exterior metalized base plate surface 24 may pass through metal vias (not shown) in the base plate or through signal pathways (not shown) running along the edges of the base plate 12 to the interior metalized base plate surface 30. Electrical signals on the interior metalized base plate surface 30 pass to the lid 10 through interconnect 40. The electrical signals are then directed to the power device 14 through the metalized vias 16 of the lid 10.

Figure 4:
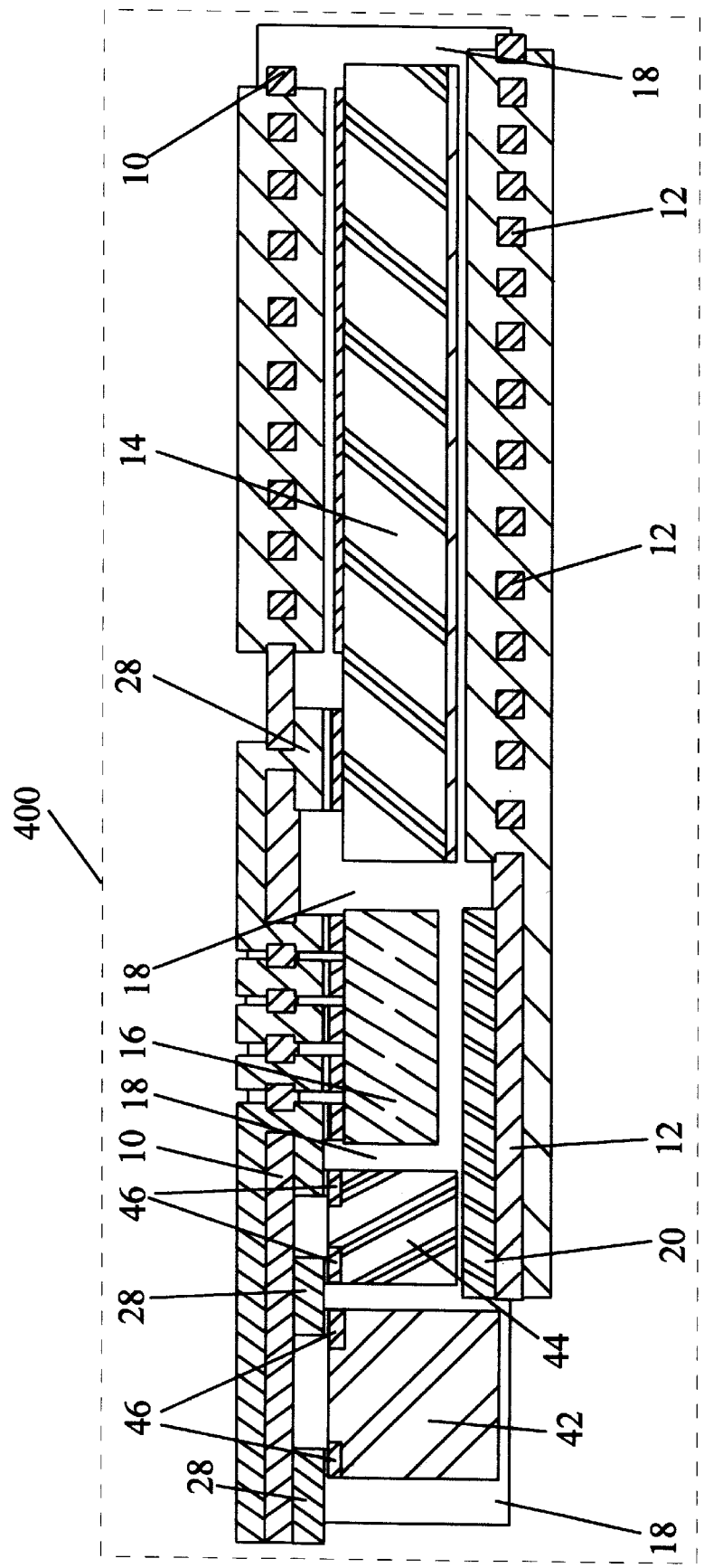
FIG. 4 is a cross-sectional view along plane A–A' of FIG. 1 illustrating a third embodiment of a power pack of the present invention.

With reference to FIG. 4, a power pack 400 includes the same structure as the power pack 200 of FIG. 2 except for the additional circuit elements 42 and 44. Each circuit elements 42 and 44 includes metalized contacts 46 that may be bonded directly to the interior metalized lid surface 32. For thicker circuit element 42, a shorter base plate 12 may be used without encroaching on the external bus and heat exchanger space on either side of the power pack 400. As in FIGS. 1–3, the seal 18 may form a cavity between the lid 10 and the base plate 12. The cavity may hold the power device 14, the driver circuit 16, circuit elements 42 and 44, and thermal gel 20. Circuit elements 42 and 44 may be resistors, capacitors, or other circuit element which may necessary for operating the driver circuit 16 and the power device 14.

The operation of the power pack 400 is the same as the as the operation of the power pack 200 illustrated in FIG. 2 with the addition of electrical signals being passed through circuit elements 42 and 44 and heat being generated by circuit elements 42 and 44 being transferred to the lid 10 and/or base plate 12.

Figure 5:
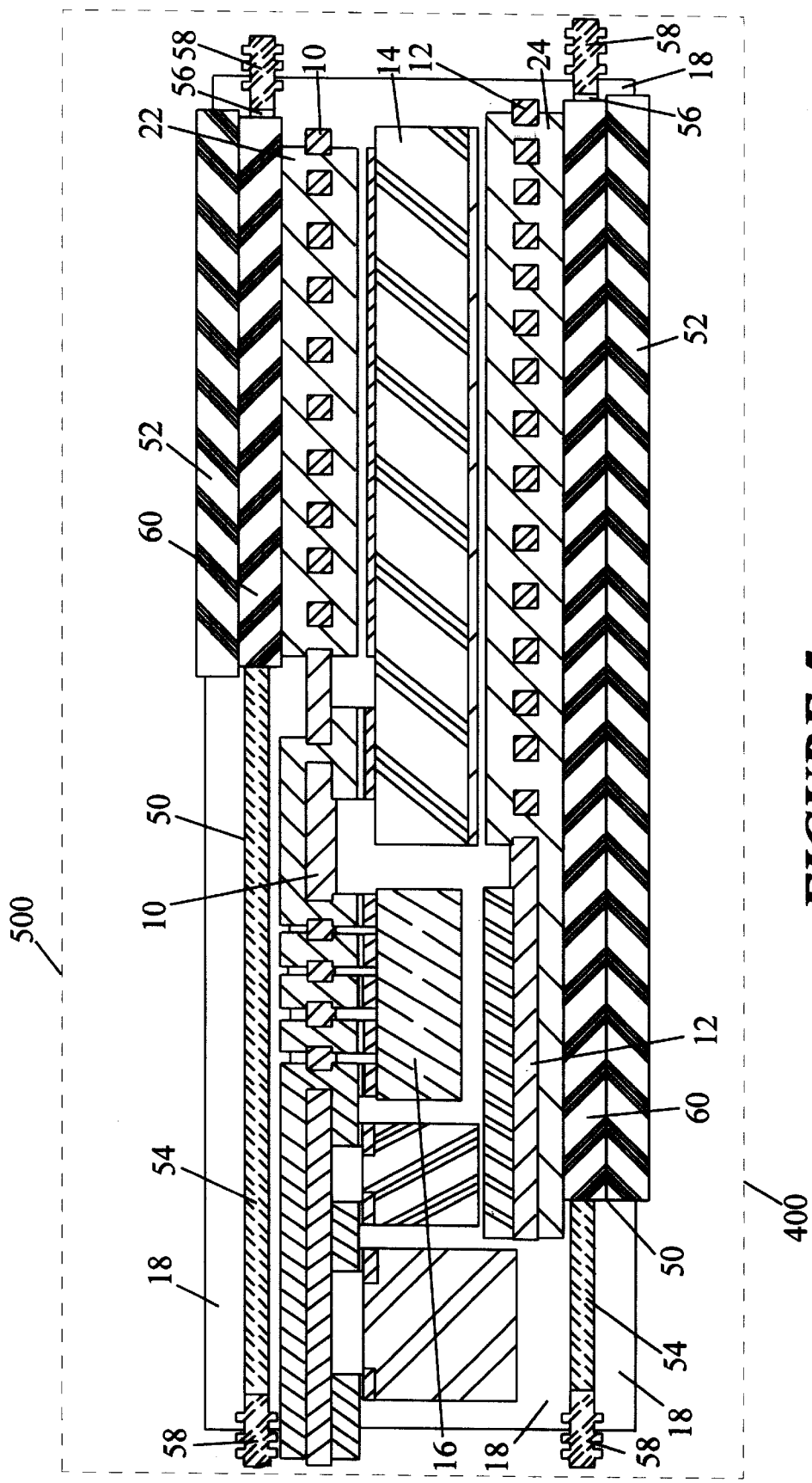
FIG. 5 is a cross-sectional view of one embodiment of a heat exchanging power pack of the present invention.

With reference to FIG. 5, a heat exchanging power pack 500 may include the same structure as power pack 400 illustrated in FIG. 4 with the addition of two heat exchangers 50 and two power electrodes 52. Each heat exchanger 50 may include a porous aluminum sponge 60, coolant channels 54 and 56, and manifolds 58. Manifolds 58 engage external tubing (not shown) for delivering a fluid coolant. Power electrodes 52 may be pressure clips for pressing each heat exchanger 50 to the power pack. Power electrodes 52 may be designed to have enough contact area and thermal mass to provide overload short term cooling. Heat exchangers 50 and power electrodes 52 may be partially enclosed by the seal 18. The thermal expansion of power electrodes 52 and seal 18 should substantially match to prevent coolant leaks.

In operation, electrical signals on power electrodes 52 pass through heat exchangers 50 to the exterior metalized lid surface 22 and exterior metalized base plate surface 24. Heat generated by the operation of the power device 14, driver circuit 16, and circuit element 44 may be transferred through the metalized surfaces and vias of the lid and base plate to the porous aluminum sponge 60 of each heat exchanger 50. A fluid coolant is directed into each of the heat exchangers 50 through corresponding manifolds 58 and channels 54 and passed through the corresponding sponge 60. The passing coolant dissipates heat transferred to each heat exchanger 50 from the electrical components of the power pack 500. Preferably, the fluid coolant is electrically inert. Heat exchangers 50 may also cool power electrodes 52.

Another approach for double-sided cooling may to immerse a power pack in an appropriate coolant.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A power pack for selectively providing electrical energy, comprising:
   a semiconductor power device for controlling an electrical energy signal to be directed through the power pack;
   a semiconductor driver circuit for controlling said power device; and
   a first and a second circuit board each having an exterior surface adapted to carry a heat exchanger,
   said driver circuit and said power device being sandwiched between said circuit boards,
   at least one of said circuit boards having electrical conduction means for conducting the electrical energy signal being controlled by said power device,
   at least one of said circuit boards having thermal conduction means for thermally conducting to the exterior surface of said one of said circuit boards the heat generated in selectively controlling the electrical energy signal,
   whereby said device and said circuit selectively control the flow of electrical energy in a power pack having two-sided cooling capability.

2. The power pack of claim 1, wherein each of said pair of circuit boards comprises a ceramic substrate.

3. The power pack of claim 1, wherein said driver circuit and power device are hermetically sealed in the sandwich formed by said pair of circuit boards.

4. The power pack of claim 1, wherein said semiconductor driver circuit and said power semiconductor device are sealed in the sandwich between said pair of circuit boards with an epoxy gel.

5. The power pack of claim 1, wherein said power semiconductor device is a switch.

6. The power pack of claim 1 further comprising connecting means on the exterior surface of at least one of the circuit boards for connecting in series with at least one other power pack.

7. The power pack of claim 1 further comprising connecting means on the exterior surface of at least one of the circuit boards for connecting in parallel with at least one other power pack.

8. The power pack of claim 1 wherein said first circuit board includes said thermal conduction means and said thermal conduction means includes a non-insulating substrate for conducting heat to be generated by said power device and said driver circuit to the exterior surface of said first circuit board.

9. The power pack of claim 8 wherein said second circuit board comprises a substrate for providing structural support for the power pack.

10. The power pack of claim 1 wherein said electrical conduction means comprises a plurality of metalized vias for conducting electrical signals through one of said circuit boards.

11. The power pack of claim 1 wherein said thermal management means comprises an insulating substrate having a plurality of metalized vias for conducting heat being generated in selectively controlling the electrical energy signal.

12. The power pack of claim 1 wherein the coefficient of thermal expansion of the said pair of circuit boards, said power semiconductor device, and said driver circuit are approximately matching.

13. The power pack of claim 1 wherein said electrical conduction means comprises a plurality of metalized vias.

14. The power pack of claim 1 wherein said power device is direct bonded to at least one of said circuit boards.

15. The power pack of claim 1 wherein said driver circuit is direct bonded to at least one of said circuit boards.

16. The power pack of claim 1 further comprising a thermal gel within the sandwich for thermally conducting heat to be generated by said driver circuit to one of said circuit boards.

17. The power pack of claim 1 wherein the exterior surface of each of said circuit boards is adapted to direct bond to a metal heat exchanger.

18. The power pack of claim 1 further comprising passive elements within the sandwich.

19. A layered power pack for regulating the flow of electricity, comprising:
    a pair of outside layers each having metalized vias and metalized surfaces for providing an electrical path through the outside layers; and
    a middle layer comprising:
      a power device for regulating current flow,
      a driver circuit spaced apart from said power device for driving said power device, and
      sealing means for hermetically sealing said power device and said driver circuit separately between said pair of outside layers,
    said power device and said driver circuit each having a metalized surface bonded to the metalized surfaces and vias of at least one of said pair of outside layers for providing an electrical path to said middle layer,
    each of said outside layers having an exterior surface adapted to bond directly to a heat exchanger to thereby provide the power pack with double sided cooling.

20. The layered power pack of claim 19 wherein each of said pair of outside layers comprises a non-insulating substrate.

21. The layered power pack of claim 19 wherein said outside layers are high temperature circuit boards.

22. The layered power pack of claim 19 further comprising a heat exchanger directly bonded to the exterior surface of one of the outside layers for transferring heat away from the power pack.

23. The layered power pack of claim 19 wherein said sealing means comprises epoxy.

24. The layered power pack of claim 19 further comprising at least two heat exchangers bonded to the exterior surface of the outside layers for two-sided cooling of the power pack.

25. The layered power pack of claim 19 wherein said power device, said driver circuit, and said pair of outside layers have approximately the same coefficient of thermal expansion.

26. In a power electronics module having a base plate, a lid, sealing means for forming a cavity between said lid and said plate, and a semiconductor power device located within the cavity, the improvement comprising a semiconductor driver circuit in the cavity operatively coupled to and spaced apart from said power device for driving said power device.

27. The power module of claim 26, wherein said lid comprises a plurality of metalized vias adapted to connect to an external bus for providing a path for electrical signals through the power pack.

28. The power module of claim 26, wherein said power semiconductor device is a switch.

29. The power module of claim 26, further comprising insulation in the sealed envelope for thermally insulating said power semiconductor device from said semiconductor driver circuit to prevent overheating.

30. The power module of claim 26, wherein the substrate of said base plate comprises a thermally conducting material for transferring heat away from the power semiconductor device and driver circuit.

31. The power module of claim 30, wherein said base plate is a high temperature circuit board.

32. The power module of claim 30, wherein said base plate comprises a plurality of metalized vias adapted to connect to an external bus for providing an electrical path through the power pack.

33. The power module of claim 30, wherein said lid is in a heat transfer relationship with said power semiconductor device and said driver circuit.

34. The power module of claim 26, wherein said lid is a high temperature circuit board.

35. The power module of claim 26, wherein said lid is in heat transfer relationship with said semiconductor driver circuit.

36. The power module of claim 26, wherein said base plate is in a heat transfer relationship with said semiconductor driver circuit.

37. The power module of claim 26, wherein said lid is in a heat transfer relationship with said power semiconductor device.

38. The power module of claim 26, wherein said base plate is in a heat transfer relationship with said power semiconductor device.

39. The power module of claim 26, wherein said lid and said base plate are in a heat transfer relationship with said power semiconductor device.

40. The power module of claim 26, wherein said semiconductor driver circuit and said power semiconductor device are hermetically sealed in the cavity between said lid and said base plate.

41. The power module of claim 26, further comprising epoxy for sealing said semiconductor driver circuit and said power semiconductor device between said plate and said lid.

42. The power module of claim 26 wherein the improvement further comprising mean on the outer surface of the lid for interfacing with other power modules.

43. The power module of claim 26 the substrate of said lid comprises a thermally conducting substrate for transferring heat away from said power semiconductor device and driver circuit.

44. The power module of claim 26 wherein said lid comprises a plurality of metalized vias for transferring heat away from said power semiconductor device and said driver circuit.

45. The power module of claim 26 wherein said base plate comprises a plurality of metalized vias for transferring heat away from said power semiconductor device and said driver circuit.

46. The power module of claim 26 wherein the coefficient of thermal expansion of said lid, said base plate, said power semiconductor device, and said driver circuit are approximately matching, thereby minimizing structural stress during expansion.

47. The power module of claim 26 wherein said lid comprises a metalized inner surface bonded directly to a metalized surface of said power semiconductor device to thereby provide a direct thermal interface between said lid and said power semiconductor device.

48. The power module of claim 26 wherein said base plate comprises a metalized inner surface bonded directly to a metalized surface of said power semiconductor device to provide a direct thermal interface between said base plate and said power semiconductor device.

49. The power module of claim 26 wherein said lid and base plate each have metalized vias and metalized internal and external surfaces, each of the external surfaces adapted to connect to an external bus for conducting electrical signal through the power pack.

50. The power module of claim 26 wherein said lid and said base plate having an exterior flat surface.

51. The power module of claim 50 further comprising a first heat exchanger directly bonded to one of the exterior surfaces for transferring heat away from the power module.

52. The power module of claim 51 further comprising a second heat exchanger directly bonded to other exterior surface for transferring heat away from the power module.

* * * * *